United States Patent
Wang et al.

(10) Patent No.: US 11,966,628 B2
(45) Date of Patent: Apr. 23, 2024

(54) MEMORY DEVICE AND OPERATING METHOD THEREOF

(71) Applicant: MACRONIX INTERNATIONAL CO., LTD., Hsinchu (TW)

(72) Inventors: Wei-Chen Wang, Taipei (TW); Han-Wen Hu, Tainan (TW); Yung-Chun Li, New Taipei (TW); Huai-Mu Wang, New Taipei (TW); Chien-Chung Ho, Chiayi County (TW); Yuan-Hao Chang, Taipei (TW); Tei-Wei Kuo, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 43 days.

(21) Appl. No.: 17/830,471

(22) Filed: Jun. 2, 2022

(65) Prior Publication Data

US 2023/0221882 A1 Jul. 13, 2023

Related U.S. Application Data

(60) Provisional application No. 63/298,612, filed on Jan. 11, 2022.

(51) Int. Cl.
*G06F 3/06* (2006.01)

(52) U.S. Cl.
CPC .......... *G06F 3/0655* (2013.01); *G06F 3/0604* (2013.01); *G06F 3/0673* (2013.01)

(58) Field of Classification Search
CPC .... G06F 3/0655; G06F 3/0604; G06F 3/0673; G06N 20/00
See application file for complete search history.

(56) References Cited

U.S. PATENT DOCUMENTS

| | | | |
|---|---|---|---|
| 11,043,205 B1* | 6/2021 | Su | G10L 15/183 |
| 2017/0083827 A1* | 3/2017 | Robatmili | G06N 20/00 |
| 2020/0356802 A1* | 11/2020 | Zhao | G06V 10/764 |
| 2021/0271597 A1* | 9/2021 | Verma | G11C 11/4097 |
| 2022/0083852 A1* | 3/2022 | Parshakova | G06F 18/2148 |

* cited by examiner

*Primary Examiner* — Baboucarr Faal
(74) *Attorney, Agent, or Firm* — McClure, Qualey & Rodack, LLP

(57) ABSTRACT

A memory device, includes a memory array for storing a plurality of vector data each of which has an MSB vector and a LSB vector. The memory array includes a plurality of memory units each of which has a first bit and a second bit. The first bit is used to store the MSB vector of each vector data, the second bit is used to store the LSB vector of each vector data. A bit line corresponding to each vector data executes one time of bit-line-setup, and reads the MSB vector and the LSB vector of each vector data according to the bit line. The threshold voltage distribution of each memory unit is divided into N states, where N is a positive integer and N is less than 2 to the power of 2, and the effective bit number stored by each memory unit is less than 2.

16 Claims, 11 Drawing Sheets

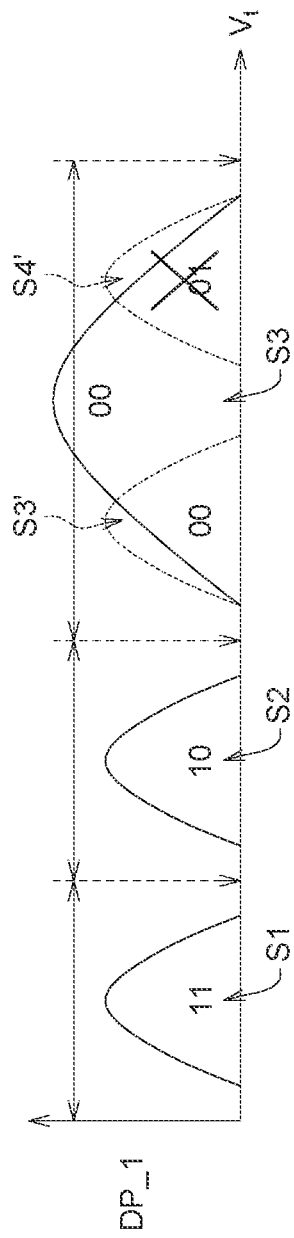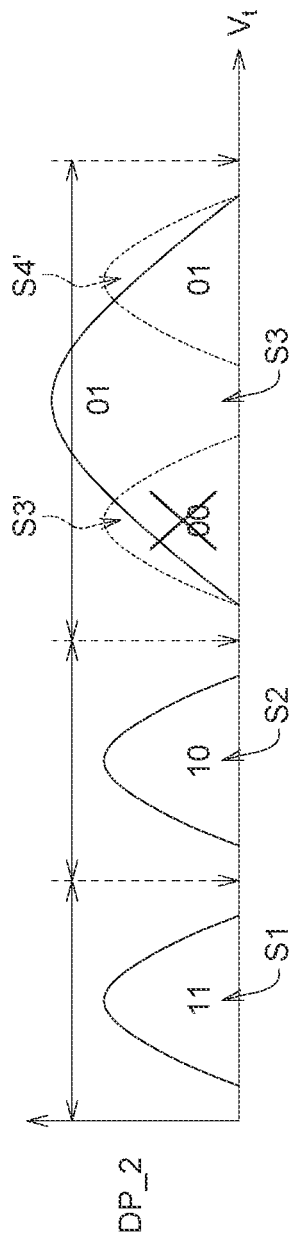

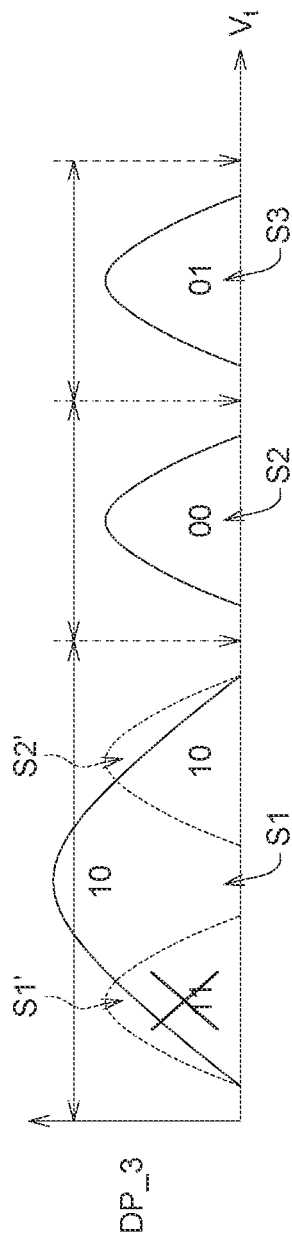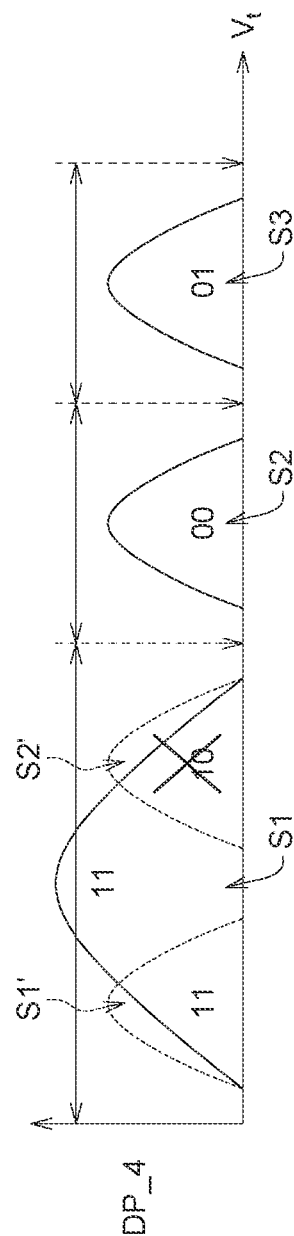

MEMORY DEVICE AND OPERATING METHOD THEREOF

This application claims the benefit of U.S. provisional application Ser. No. 63/298,612, filed Jan. 11, 2022, the subject matter of which is incorporated herein by reference.

TECHNICAL FIELD

The present disclosure relates to a semiconductor device and an operating method thereof, and more particularly, to a memory device and an in-memory computation method.

BACKGROUND

With the rapid development of artificial intelligence (AI) algorithms, researchers seek hardware devices suitable for executing AI algorithms. Semiconductor memory devices, such as NAND-type memory arrays, may perform AI computations through in-memory computation (IMC). When performing a multiply-and-accumulate (MAC) operation commonly used in AI, each memory unit of the memory array may output current to the bit line according to a result of multiplying-operation, and accumulate currents on the same bit line to generate a result of accumulating-operation.

In a memory array, performing the MAC-operation in an analog manner may achieve a faster computation speed. However, overlaps of the current distribution may lead to misjudgment of the computation result, thereby reducing computation accuracy.

On the other hand, when reading data stored in the memory array, it may need to perform several times of bit-line-setups and hence consume several of setup-time, thereby reducing the computation speed.

In addition, when the memory array uses multi-level cells (MLC) (or referred to as "two-levels cells") to store data, threshold voltage distribution of the memory units may have a larger number of states, which will lead to narrowing of the voltage intervals for the reading-voltage, and error in the reading-operation may be caused.

In view of the above-mentioned technical problem, those skilled of the related industries in the technical field are devoted to improve storing mechanism of memory units and operating method of IMC, so as to enhance computation accuracy and computation speed.

SUMMARY

Technical solutions of the present disclosure provide executing digital MAC-operation by memory array, reducing the number of states of threshold voltage distribution of memory units and reducing the number of bit-line-setups, so as to enhance computation accuracy and computation speed.

According to an aspect of the present disclosure, a memory device is provided, which includes a memory array for storing a plurality of vector data. Each of the vector data has an MSB vector and a LSB vector. The memory array includes a plurality of memory units, each of the memory units has a first bit and a second bit. The first bit is used to store the MSB vector of each vector data, and the second bit is used to store the LSB vector of each vector data. A bit line corresponding to each vector data executes one time of bit-line-setup, and reads the MSB vector and the LSB vector of each vector data according to the bit line. The threshold voltage distribution of each memory unit is divided into N states, where N is a positive integer and N is less than 2 to the power of 2, and the effective bit number stored by each memory unit is less than 2.

According to an aspect of the present disclosure, an operating method of a memory device is provided, wherein the memory device includes a memory array, the memory array includes a plurality of memory units, each memory unit has a first bit and a second bit, the operating method comprising the following steps. Storing a plurality of vector data in the memory array, each vector data has an MSB vector and a LSB vector. Storing the MSB vector of each vector data in the first bit. Storing the LSB vector of each vector data in the second bit. Executing one time of bit-line-setup for a bit line corresponding to each vector data. Reading the MSB vector and the LSB vector of each vector data according to the bit line. The threshold voltage distribution of each memory unit is divided into N states, N is a positive integer and N is less than 2 to the power of 2, and the effective bit number stored by each memory unit is less than 2.

BRIEF DESCRIPTION OF THE DRAWINGS

FIGS. 4A to 4D are schematic diagrams illustrating states of threshold voltage distribution of a 1.5-bit MLC memory unit according to various embodiments of the present disclosure.

Figure 1A:
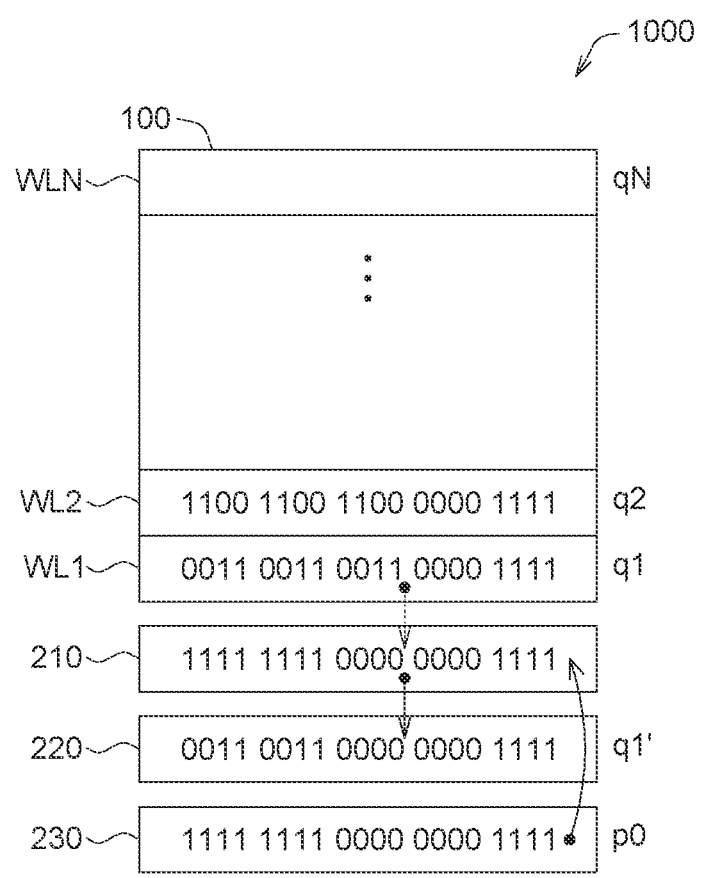
FIG. 1A is a schematic diagram of a memory device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1A is a schematic diagram of a memory device 1000 according to an embodiment of the present disclosure. Referring to FIG. 1A, the memory device 1000 includes a memory array 100 and a plurality of data latches 210, 220 and 230. The memory device 1000 may be used to perform in-memory computation (IMC), such as multiply-and-accumulate (MAC) operations. More specifically, the memory device 1000 of the present disclosure is used to perform digital MAC-operations to improve computation accuracy. The data latch 210 may be referred to as a "first data latch", and the data latch 220 may be referred to as a "second data latch". In addition, the data latch 230 may be referred to as a "common data latch (CDL)", which may serve as an input/output interface of the memory device 1000.

The memory array 100 includes a plurality of word lines WL1-WLN, each of the word lines WL1-WLN may store a vector data. When the memory device 1000 is used to perform a MAC-operation of face recognition algorithm, the feature vectors q1-qN of N faces F1-FN may be pre-stored in the word lines WL1-WLN of the memory array 100. For example, the feature vector q1 of the first face F1 is a 20-bit binary data "00110011001100001111" which is stored in the word line WL1, and the feature vector q2 of the second face F2 is a 20-bit data "11001100110000001111" which is stored in the word line and so on.

Moreover, each of the memory units (or memory units) in the memory array 100 of the present disclosure is 1.5-bit multi-level cell (MLC). Compared with the normal 2-bit MLC memory unit (hereinafter referred to as "2-bit MLC"), the 1.5-bit MLC memory unit (hereinafter referred to as "1.5-bit MLC") of the present disclosure stores a less amount of data, and the equivalent number of bits is 1.5 bits. The mechanism of the 1.5-bit MLC will be described in detail later.

The data latch 230 (i.e., the common data latch (CDL)) may temporarily store vector data inputted from the memory device 1000 externally. When performing face recognition or face search, the feature vector p0 of the face F0 to be recognized may be externally inputted to the memory device 1000 and temporarily stored in the data latch 230. The feature vector p0 is, for example, a data of 20 bits "11111111000000001111". Then, the feature vector p0 is transferred from the data latch 230 to the data latch 210.

A "selective bit line (BL) read" operation may be performed in the memory array 100 to read the feature vectors q1-qN from the word lines WL1-WLN respectively, and the selective BL read operation may have a function of multiplying-operation. The feature vector p0 to be identified may be referred to as "input feature vector p0", and the pre-stored feature vectors q1-qN may be referred to as "weight feature vector qi", where i=1-N. The selective BL read operation may achieve the multiplying-operation of the input feature vector p0 and the weight feature vector qi. When a bit of the feature vector p0 and the corresponding bit of the feature vector qi are both "1", the selective BL read operation may read the bit of the feature vector qi as "1". When a bit of the feature vector p0 is "0" or the corresponding bit of the feature vector qi is "0", selective BL read operation may read the bit of the feature vector qi as "0". Accordingly, the output result qi'=p0*qi obtained by the selective BL read operation. The output result qi' may be referred to as "output feature vector qi'". For example, the feature vector p0 is "11111111000000001111", the feature vector q1 of the first face F1 is "00110011001100001111", and the output feature vector q1' obtained by the selective BL read operation is "00110011000000001111". Then, the output feature vector q1' may be written into the data latch 220.

Then, an accumulating-operation may be performed on the output feature vector q1' which is temporarily stored in the data latch 220, so as to accumulate the bits of "1" in the output feature vector q1'. In one example of the accumulating-operation, the memory device 1000 may execute a fail-bit-count instruction to perform a counting-operation on the output feature vector q1'. Taking the output feature vector q1'="00110011000000001111" as an example, the 8 bits of B0~B3, B12, B13, B16 and B17 are "1", and the counting result C1 of the output feature vector err is a decimal "8", and the counting result C1 is the MAC-operation result MAC1 of the feature vector p0 and the feature vector q1 Then, the counting result C1 may be transferred to the data latch 230, and the counting result C1 may be outputted to the exterior of the memory device 1000.

In the face recognition algorithm, the similarity between the pre-stored face F1 and the face F0 to be recognized may be represented as the inner product "$\|q1\|\|p0\|\cos\theta$" of the feature vector p0 and the feature vector q1. When the similarity between the face F1 and the face F0 is higher, the angle "$\theta$" is closer to zero, and the inner product of the feature vector p0 and the feature vector q1 is close to "$\|q1\|\|p0\|$". Therefore, the similarity between the face F1 and the face F0 to be recognized may be estimated according to the MAC-operation result MAC1 of the feature vector p0 and the feature vector q1.

Figure 1B:
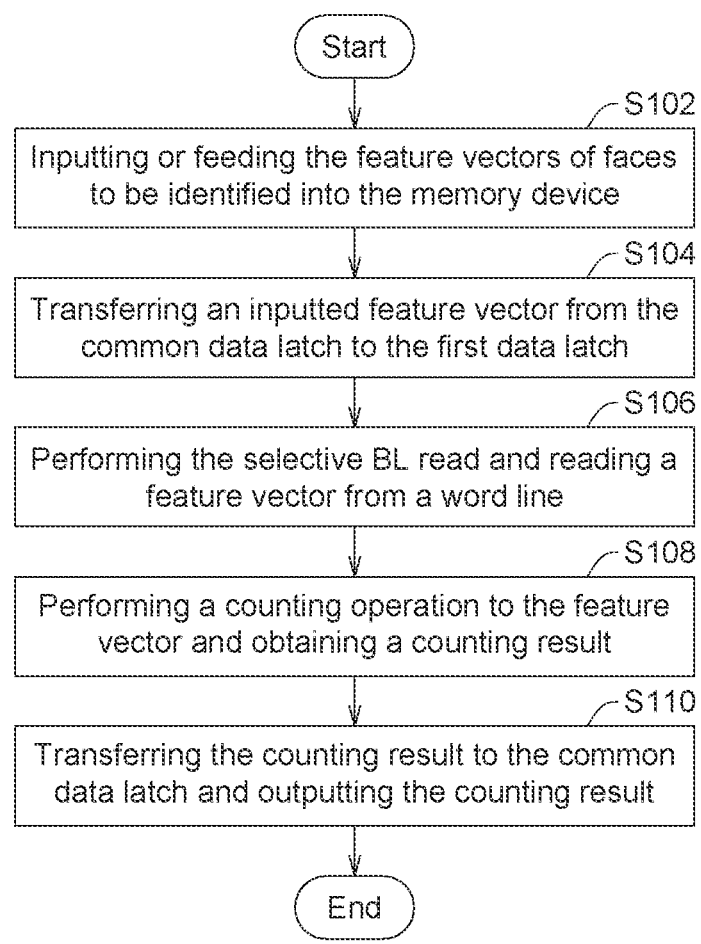
FIG. 1B is a flowchart of the MAC-operation performed by the memory device of the present disclosure.

FIG. 1B is a flowchart of the MAC-operation performed by the memory device 1000 of the present disclosure. Referring to FIG. 1B (and considering the memory device 1000 of FIG. 1A), in step S102, the feature vector p0 of the face F0 to be recognized is inputted or fed into the memory device 1000. The feature vector p0 may be temporarily stored in the data latch 230.

Then, in step S104, the feature vector p0 is transferred from the data latch 230 (i.e., the common data latch (CDL)) to the data latch 210 (i.e., the first data latch). Then, in step S106, a selective BL read operation is performed, so as to read the feature vectors q1-qN from the word lines WL1-WLN of the memory array 100 respectively and perform a multiplying-operation thereon. The output feature vectors q1'-qN' obtained by the selective BL read operation are products of the feature vectors q1-qN and the feature vector p0. The output feature vectors q1'-qN' may be temporarily stored in the data latch 220 in sequence.

Then, in step S108, a counting-operation is performed on the output feature vectors q1'-qN' temporarily stored in the data latch 220 respectively, so as to obtain a counting result C1. Then, in step S110, the counting result C1 may be transferred to the data latch 230, and the counting result C1 may be outputted through the data latch 230.

On the other hand, referring to Table 1 and Table 2. Table 1 shows a data allocation DA_1 of a normal 2-bit MLC of a comparative example. A physical page in a memory array may include a plurality of logical pages, such as high pages and low pages. Taking a normal 2-bit MLC as an example, the high page corresponds to the first bit CB1 of the MLC, and the low page corresponds to the second bit CB2 of the MLC. In the data allocation DA_1 of the comparative example, the feature vectors of different faces may be stored in the high page or the low page respectively. For example, the feature vector q1 of the first face F1 out of the faces F1-FN is stored in the high page, the feature vector q2 of the second face F2 is stored in the low page.

TABLE 1

| (data allocation DA_1) | |
|---|---|
| High page (the first bit CB1) | Feature vector q1 of face F1 |
| Low page (the second bit CB2) | Feature vector q2 of face F2 |

Table 2 shows a data allocation DA_2 of the 1.5-bit MLC of the present disclosure. The data of each 8 bits of the feature vector of the face can be divided into vectors of most significant bits (MSB) and least significant bits (LSB). For example, the feature vector q1 of the face F1 is divided into an MSB vector and an LSB vector, and each of the MSB vector and the LSB vector has, for example, 4 bits. The data of the MSB vector is more important and hence stored in the high page, and the data of the LSB vector less important and hence stored in the low page. Similarly, the MSB vector of the feature vector q2 of the next face F2 is stored in the high page, and the LSB vector of the feature vector q2 is stored in the low page. Moreover, the high page corresponds to the first bit CB1 of the 1.5-bit MLC of the present disclosure, and the low page corresponds to the second bit CB2 of the 1.5-bit MLC.

TABLE 2

(data allocation DA_2)

| High page (the first bit CB1) | MSB vector of feature vector q1 of face F1 | MSB vector of feature vector q2 of face F2 |
|---|---|---|
| Low page (the second bit CB2) | LSB vector of feature vector q1 of face F1 | LSB vector of feature vector q2 of face F2 |

Figure 2A:
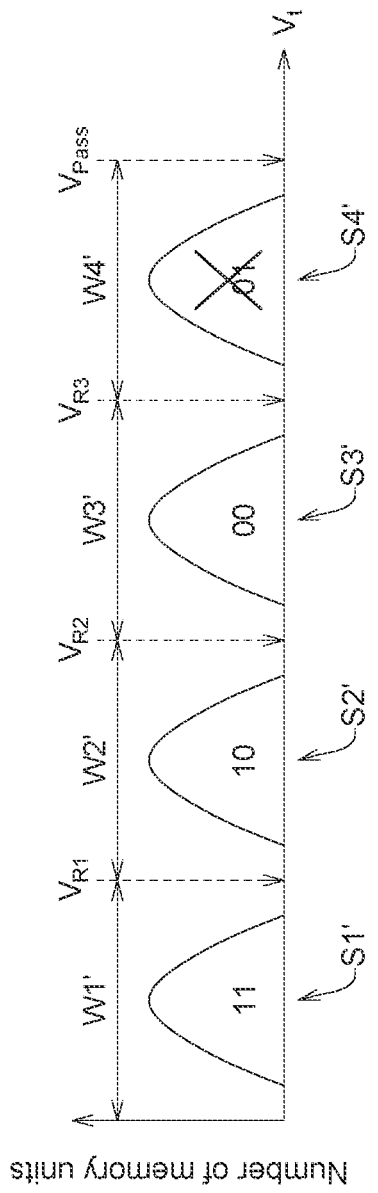
FIG. 2A is a schematic diagram illustrating states of threshold voltage distribution of a normal 2-bit MLC memory unit.
Figure 2B:
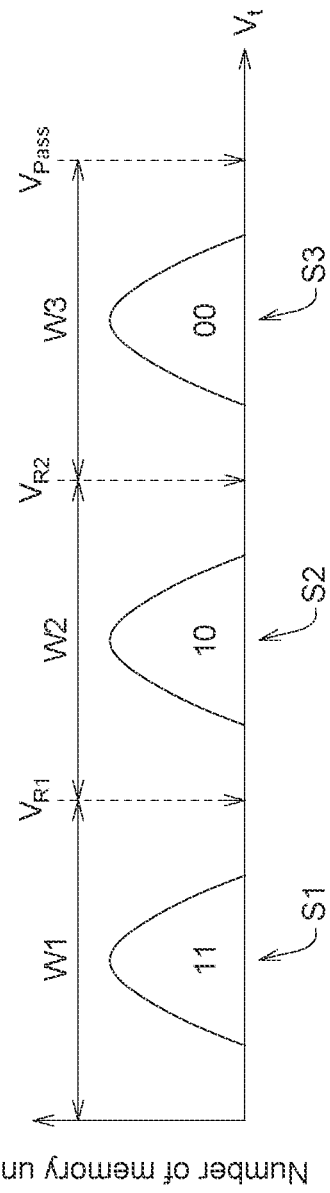
FIG. 2B is a schematic diagram illustrating states of threshold voltage distribution of a 1.5-bit MLC memory unit according to an embodiment of the present disclosure.

FIG. 2A is a schematic diagram illustrating states of threshold voltage distribution of a normal 2-bit MLC memory unit. FIG. 2B is a schematic diagram illustrating states of threshold voltage distribution of a 1.5-bit MLC memory unit according to an embodiment of the present disclosure, which may describe mechanism of the 1.5-bit MLC.

Please refer to FIG. 2A first, the threshold voltage Vt of the memory unit may be programmed as different voltage levels, and a normal 2-bit MLC may have 4 states S1'-S4' according to the distribution of the programmed threshold voltage Vt. The number of "4" for states S1'-S4' is equal to 2 to the power of 2. The state S1" is between 0 v (zero potential) and the reading voltage $V_{R1}$, the state S1' is between the reading voltage $V_{R1}$ and the reading voltage $V_{R2}$, and the state S3' is between the reading voltage $V_{R2}$ and the reading voltage $V_{R3}$, the state S4' is between the reading voltage $V_{R3}$ and the pass voltage $V_{Pass}$. Normal 2-bit MLC may store 2-bit data (CB1, CB2). State S1' corresponds to data (CB1=1, CB2=1), the state S2' corresponds to data (CB1=1, CB2=0), the state S3' corresponds to data (CB1=0, CB2=0), the state 34' corresponds to data (CB1=0, CB2=1). The voltage intervals W1'-W4' corresponding to the states S1-S4' of the normal 2-bit MLC are narrower, which may lead to reading errors of the data (CB1, CB2), thereby degrading accuracy of the in-memory computation (such as MAC-operation).

Please refer to FIG. 2B, for the 1.5-bit MLC of the present disclosure, distribution of the threshold voltage Vt is only divided into N states, where N is less than 2 to the power of 2. For example, N=3, and the 1.5-bit MLC has 3 states S1-S3. The state S1 is between 0 v (zero potential) and the reading voltage $V_{R1}$, the state S2 is between the reading voltage $V_{R1}$ and the reading voltage $V_{R2}$, and the state S3 is between the reading voltage $V_{R2}$ and the pass voltage $V_{Pass}$. The equivalent number of bits of data that may be stored in a 1.5-bit MLC is 1.5 bits. State S1 corresponds to data (CB1=1, CB2=1), the state S2 corresponds to data (CB1=1, CB2=0), and the state S3 corresponds to the data (CB1=0, CB2=0). In other words, the 1.5-bit MLC does not include data (CB1=0, CB2=1), and the states S3' and S4' of the normal 2-bit MLC may be regarded as a single state S3 of the 1.5-bit MLC. The voltage intervals W1-W3 corresponding to the states S1-53 of the 1.5-bit MLC is larger than the voltage intervals W1-W4' of the normal 2-bit MLC. Therefore, reading accuracy of the data (CB1, CB2) of the 1.5-bit MLC may be enhanced.

Table 3 shows an example of contents of the first bit CB1 and the second bit CB2, which may show the difference between the data (CB1, CB2) of the 1.5-bit MLC and the normal 2-bit MLC.

TABLE 3

| Normal 2-bit MLC | |
|---|---|
| High page | The first bit CB1 10010100 |
| Low page | The second bit CB2 01011011 |
| 1.5-bit MLC | |
| High page | The first bit CB1 10010100 |
| Low page | The second bit CB2 00010000 |

The memory device 1000 of the present disclosure uses 1.5-bit MLC to improve accuracy of data reading. Furthermore, in operation the memory device 1000 reduces redundant bit-line-setup (BL setup) to reduce time which is required for data reading.

For normal 2-bit MLC, the reading-operation of the second bit CB2 of the low page needs to perform one time of bit line setup and apply one time of reading voltage $V_{R2}$. One setup-time t_BL_S for bit-line-setup is, for example, 60 μs, and the reading-time t_Vread corresponding to applying reading voltage $V_{R2}$ is, for example, 15 μs. That is, the execution time of the reading-operation of the second bit CB2 is approximately 60 μs+15 μs=75 μs. On the other hand, the reading-operation of the first bit CB1 of the high page needs to perform one time of bit-line-setup and apply two times of reading voltages $V_{R1}$ and $V_{R3}$. That is, the execution time of the reading-operation of the first bit CB1 is approximately 60 μs+2*15 μs=90 μs. From the above, the reading-time of the data (CB1, CB2) of high page and low page of a normal 2-bit MLC is approximately 75 μs+90 μs=165 μs.

In addition, for normal 1-bit single-level cell (SLC), since normal 1-bit SLC only stores 1-bit data, reading of 2-bit data requires two times of reading-operations. One time of reading-operation needs to perform one time of bit-line-setup and apply one time of reading voltage $V_{R1}$, and execution time thereof is approximately 60 μs+15 μs=75 μs. Therefore, reading-time for a normal 1-bit SLC to read 2-bit data is approximately 2*75 μs=150 μs.

In contrast, the memory device 1000 of the present disclosure only performs one time of bit-line-setup when performing reading-operation of the first bit CB1 and the second bit CB2, therefore, only one of setup-time t_BL_S=60 μs is required. Moreover, the 1.5-bit MLC used in the memory device 1000 of the present disclosure only operates at two reading voltages $V_{R1}$ and $V_{R2}$, therefore, only two of reading-time t_Vread are required, i.e., 2*15 μs=30 μs. From the above, reading-time of data (CB1, CB2) of high page and low page of the 1.5-bit MLC is approximately 60 μs+30 μs=90 μs. Accordingly, the memory device 1000 of the present disclosure performs only one time of bit line setup with the 1.5-bit MLC so as to greatly improve reading-time-latency, compared with reading-time of 165 μs of normal 2-bit MLC and reading-time of 150 μs of normal 1-bit SLC.

Figure 3:
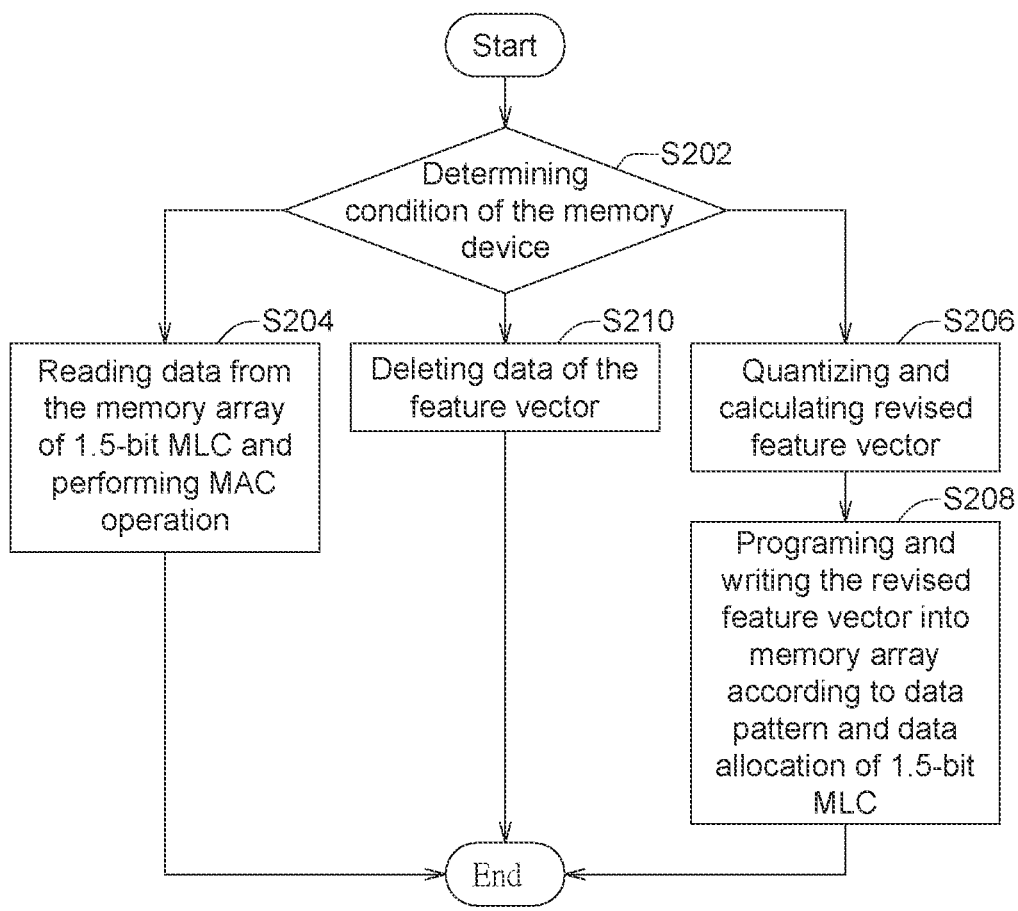
FIG. 3 is a flowchart of another embodiment of the MAC-operation performed by the memory device of the present disclosure.

FIG. 3 is a flowchart of another embodiment of the MAC-operation performed by the memory device 1000 of the present disclosure. Referring to FIG. 3, in step S202, the condition of the memory device 1000 is determined. When it is determined that the memory device 1000 will perform the MAC-operation, then step S204 is performed: reading data of the feature vector qi from the memory array 100 which is composed of 1.5-bit MLC. For example, an instruction of selective BL read operation is executed, and one time of bit-line-setup and two of reading voltages $V_{R1}$, $V_{R2}$ are applied so as to read each data (CB1, CB2) of the 1.5-bit MLC. The first bit CB1 stored in the high page of the memory array 100 corresponds to the MSB vector of the feature vector qi, and the second bit CB2 stored in the low page corresponds to the LSB vector of the feature vector qi. Furthermore, counting-operations with different amounts of data may be performed for the MSB vector and the LSB vector respectively, so as to perform the accumulating-operation.

On the other hand, in step S202, when it is determined that the memory device 1000 will remove the data, then proceeding to step S210: delete the data. For example, the N feature vectors q1-qN stored in the memory array 100 are deleted.

On the other hand, in step S202, when it is determined that the memory device 1000 will create data, insert data or update data, then proceeding to step S206: quantize and calculate revised feature vector qi. Next, executing step S208: programing and writing the data of revised feature vector qi into the memory array 100. The writing-operation of the data of the feature vector qi may be performed according to the data pattern of the 1.5-bit MLC shown in FIG. 2B and the data allocation shown in Table 2.

FIGS. 4A to 4D are schematic diagrams illustrating states of threshold voltage distribution of a 1.5-bit MLC memory unit according to various embodiments of the present disclosure, respectively illustrating different data patterns of the 1.5-bit MLC. Please refer to FIG. 4A first, in the first data pattern DP_1 of the 1.5-bit MLC, the state S1 of distribution of threshold voltage Vt corresponds to data (CB1=1, CB2=1), and the state S2 corresponds to data (CB1=1, CB2=0), the state S3 corresponds to data (CB1=0, CB2=0). The state S3' and state S4' of the normal 2-bit MLC may be regarded as a single state S3 of the 1.5-bit MLC, and the first data pattern DP_1 of the 1.5-bit MLC does not include data (CB1=0, CB2=1), but regard the second bit CB2="1" in data (CB1=0, CB2=1) as "0". Since the second bit CB2 corresponds to the low page to store the LSB vectors of less importance for data, regarding the second bit CB2="1" as "0" will not affect precision of data.

Please refer to FIG. 4B, in the second data pattern DP_2 of the 1.5-bit MLC, the state S1 of distribution of threshold voltage Vt corresponds to data (CB1=1, CB2=1), the state S2 corresponds to data (CB1=1, CB2=0), and the state S3 corresponds to data (CB1=0, CB2=1). The state S3' and state S4' of the normal 2-bit MLC may be regarded as a single state S3 of the 1.5-bit MLC, and the second data pattern DP_2 of the 1.5-bit MLC does not include data (CB1=0, CB2=0) but regard the second bit CB2=0 in data (CB1=0, CB2=0) as second bit CB2=1.

Please refer to FIG. 4C, in the third data pattern DP_3 of the 1.5-bit MLC, the state S1 of distribution of threshold voltage Vt corresponds to data (CB1=1, CB2=0), the state S2 corresponds to data (CB1=0, 0B2=0), and the state S3 corresponds to data (CB1=0, CB2=1). The state S1' and state S2' of the normal 2-bit MLC may be regarded as a single state S1 of the 1.5-bit MLC, and the third data pattern DP_3 of the 1.5-bit MLC does not include data (CB1=1, CB2=1), but regard the second bit CB2=1 in data (CB1=1, CB2=1) as the second bit CB2=0.

Please refer to FIG. 4D, in the fourth data pattern DP_4 of the 1.5-bit MLC the state S1 of distribution of threshold voltage Vt corresponds to data (CB1=1, CB2=1), the state S2 corresponds to data (CB1=0, CB2=0), and the state S3 corresponds to data (CB1=0, CB2=1). The state S1' and state S2' of the normal 2-bit MLC may be regarded as a single state S1 of the 1.5-bit MLC, and the fourth data pattern DP_4 of the 1.5-bit MLC does not include data (CB1=1, CB2=0), but regard the second bit CB2="0" in data (CB1=1, CB2=0) as "1".

The first data pattern DP_1 to the fourth data pattern DP_4 of the 1.5-bit MLC shown in FIGS. 4A to 4D may be implemented in the memory device 1000 of the present disclosure with the data allocation DA_2 shown in Table 2, so as to store the MSB vector and the LSB vector of the feature vector qi to perform the MAC-operation. In the first data pattern DP_1 to the fourth data pattern DP_4, the second bit CB2="0" is regarded as "1". Since the second bit CB2 corresponds to the low page to store the LSB vectors of less importance of data, regarding the second bit CB2="0" as "1" will not affect precision of data.

Figure 5A:
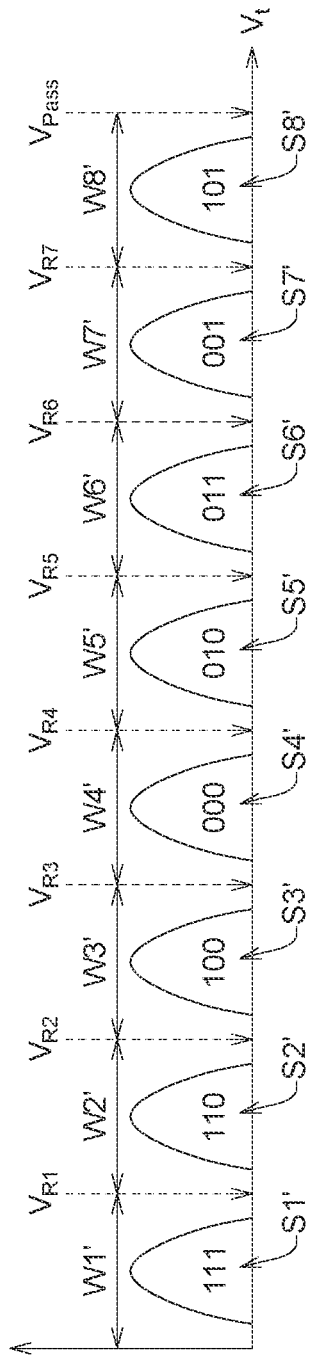
FIG. 5A is a schematic diagram illustrating states of threshold voltage distribution of a normal 3-bit TLC memory unit.

In other examples, the memory unit of the memory device 1000 of the present disclosure may also be a triple level cell (TLC), and the TLC memory unit may have a first bit CB1, a second bit CB2 and a third bit 083. Please refer to FIG. 5A, which is a schematic diagram illustrating states of threshold voltage distribution of a normal 3-bit TLC memory unit. A normal 3-bit TLC may have 8 states S1'~S8' corresponding to 3-bit data (CB1, CB2, CB3). The number "8" for the states S1'-S8' is equal to 2 to the power of 3. The state S1' corresponds to data (CB1=1, CB2=1, CB3=1), the state S2' corresponds to data (CB1=1, CB2=1, CB3=0), the state S3' corresponds to data (CB1=CB2=0, CB3=0), the state S4' corresponds to data (CB1=0, CB2=0, CB3=0), the state S5' corresponds to data (CB1=0, CB2=1, CB3=0), the state S6' corresponds to data (CB1=0, CB2=1, CB3=1), the state S7' corresponds to data (CB1=0, CB2=0, CB3=1) and the state S8' corresponds to data (CB1=1, CB2=0, CB3=1). The states S1'~S8' correspond to narrower voltage intervals W1'-W8' respectively, which may lead to reading errors of data (CB1, CB2, CB3).

Figure 5B:
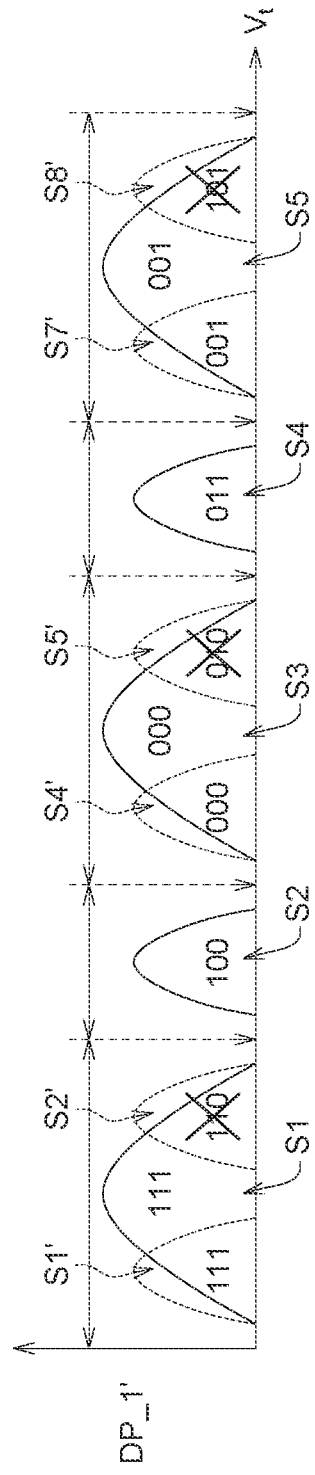
FIG. 5B is a schematic diagram illustrating states of threshold voltage distribution of the TLC memory unit of the present disclosure.
Figure 5C:
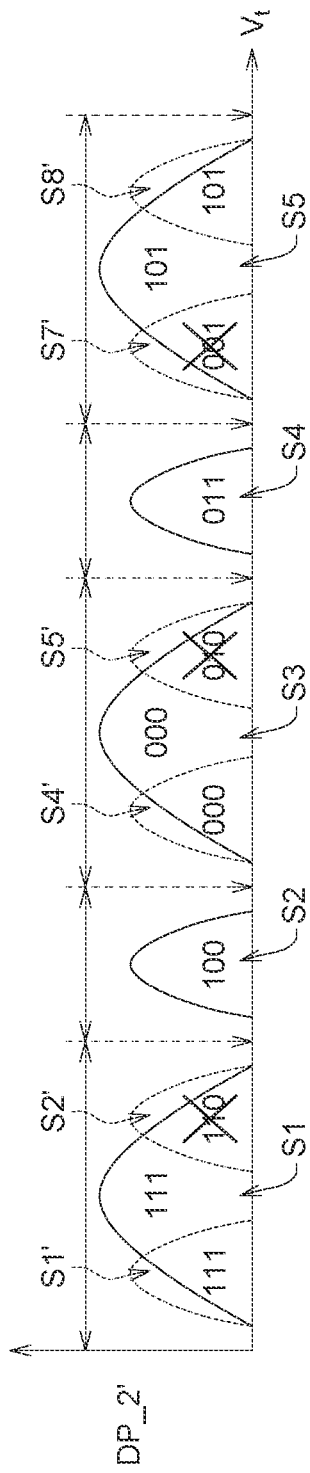
FIGS. 5C to 5I are schematic diagrams illustrating states of threshold voltage distribution of the TLC memory unit in various embodiments of the present disclosure.

Please refer to FIG. 5B, which is a schematic diagram illustrating states of threshold voltage distribution of the TLC memory unit of the present disclosure. Distribution of the threshold voltage Vt of the TLC in this embodiment is only divided into M states, where M is less than 2 to the power of 3. For example, M=5, and the TLC of this embodiment has 5 states S1-S5. The state S1 corresponds to data (CB1=1, CB2=1, CB3=1), the state S2 corresponds to data (CB1=1, CB2=0, CB3=0), the state S3 corresponds to data (CB1=0, CB2=0, CB3=0), the state S4 corresponds to data (CB1=0, CB2=1, CB3=1) and the state S5 corresponds to data (CB1=0, CB2=0, CB3=1). The data stored in the TLC in this embodiment does not include data (CB1=1, CB2=1, CB3=0), and the state S1' and state S2' of the normal 3-bit TLC may be regarded as a single state S1 of the TLC in this embodiment. Similarly, the state S4' and state S5' of the normal 3-bit TLC are regarded as a single state S3 of the TLC in this embodiment, and data (CB1=0, CB2=1, CB3=0) is excluded. The state S7' and state S8' of the normal 3-bit TLC are regarded as a single state S5 of the TLC of this embodiment, and data (CB1=1, CB2=0, CB3=1) is excluded. Although the equivalent number of bits of data stored in the TLC in this embodiment is less than 3 bits, the voltage intervals corresponding to the states S1 to S5 of the TLC in this embodiment are relatively large, which may improve the reading accuracy of data (CB1, CB2, CB3). The patterns of corresponding data (CB1, CB2, CB3) of states S1-S5 shown in FIG. 5B may be referred to as the first data pattern DP_1' of the TLC.

FIGS. 5C to 5I are schematic diagrams illustrating states of threshold voltage distribution of the TLC memory unit in various embodiments of the present disclosure, illustrating different data patterns of the TLC.

First, the second data pattern DP_2' shown in FIG. 5O is similar to the first data pattern DP_1', except that, the state S7' and state S8' of the normal 3-bit TLC are regarded as a single state S5 of the TLC by excluding data (CB1=0, CB2=0 CB3=1).

Figure 5D:
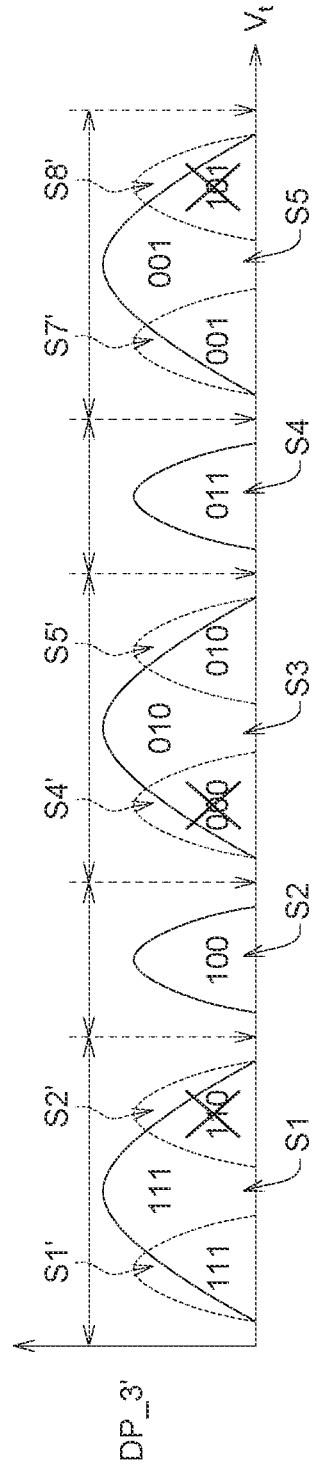
Figure 5E:
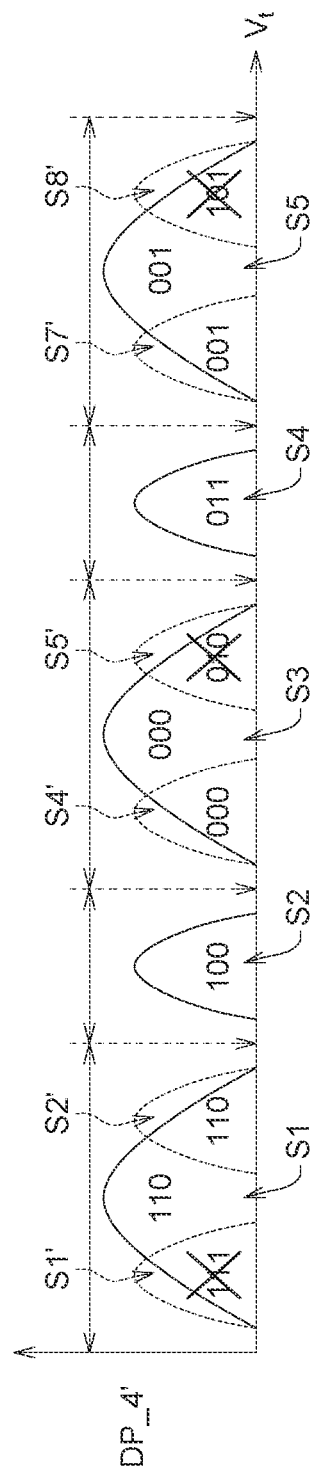
Figure 5F:
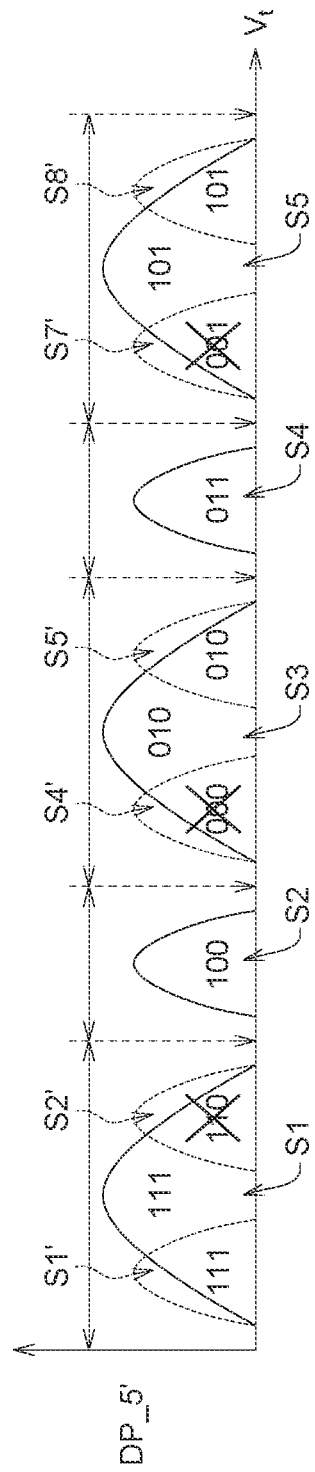
Figure 5G:
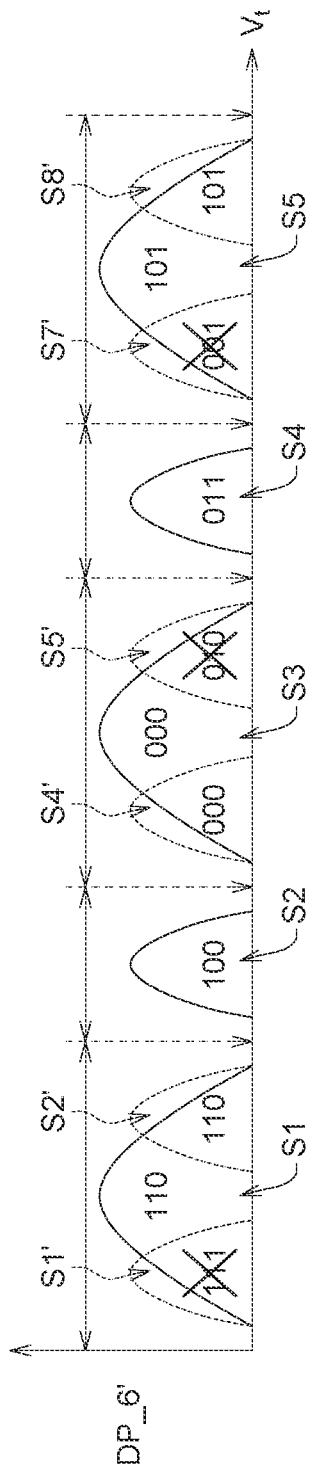
Figure 5H:
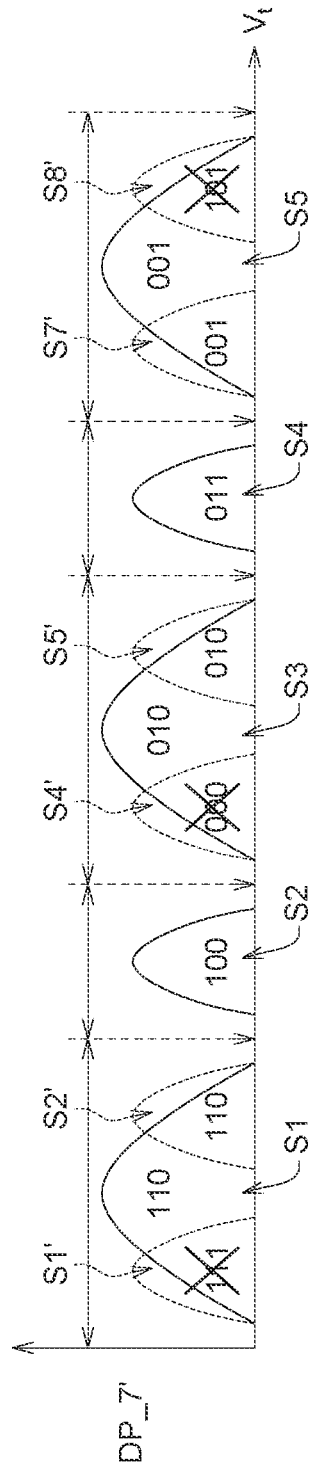
Figure 5I:
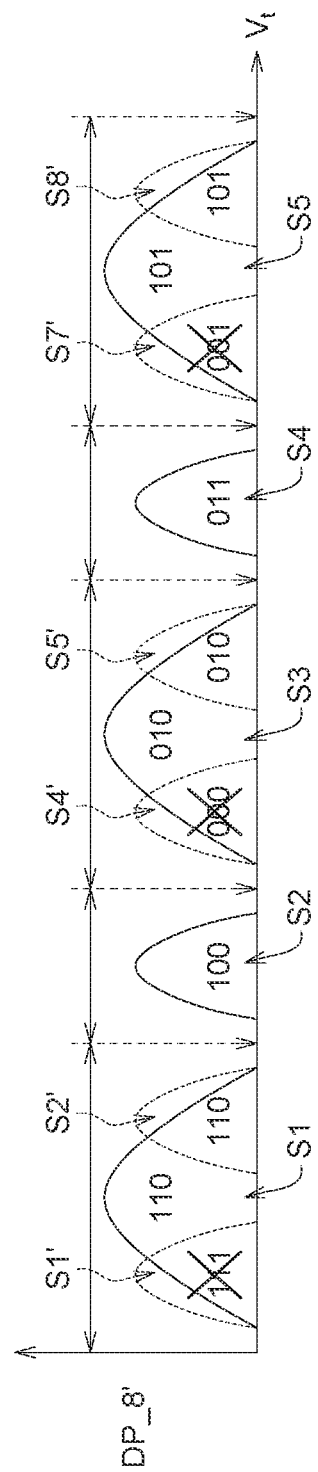

According to variations of data arrangements, other data patterns of TLC may be obtained. The third data pattern DP_3' shown in FIG. 5D is similar to the first data pattern DP_1', except that, data (CB1=0, CB2=0, CB3=0) excluded. The fourth data pattern DP_4' shown in FIG. 5E is similar to the first data pattern DP_1', and the difference lies in: data (CB1=0, CB2=1, CB3=1) is excluded. The fifth data pattern shown in FIG. 5F is similar to the third data pattern except that, data (CB1=0, CB2=0, CB3=1) is excluded. The sixth data pattern DP_6' shown in FIG. 5G is similar to the fourth data pattern DP_4', and the difference lies in: data (CB1=0, CB2=0, CB3=1) is excluded. The seventh data pattern shown in FIG. 5H is similar to the fourth data pattern DP_4', except that, data (CB1=0, CB2=0, CB3=0) is excluded. The eighth data pattern shown in FIG. 5I is similar to the seventh data pattern DP_7', and the difference lies in: data (CB1=0, CB2=0, CB3=1) is excluded.

On the other hand, please refer to Table 4 and Table 5. Table 4 shows the data allocation DA_3 of the normal 3-bit TLC of another comparative example. A physical page of the memory array may include a high page, a middle page and a low page, which respectively correspond to the first bit CB1, the second bit CB2 and the third bit CB3 of the TLC memory units. The feature vector q1 of the first face F1 out of the faces F1~FN is stored in the high page, the feature vector q2 of the second face F2 is stored in the middle page, and the feature vector q3 of the third face F3 is stored in low page.

TABLE 4

(data allocation DA_3)

| | |
|---|---|
| High page (the first bit CB1) | Feature vector q1 of face F1 |
| Middle page (the second bit CB2) | Feature vector q2 of face F2 |
| low page (the third bit CB3) | Feature vector q3 of face F3 |

Table 5 shows the data allocation DA_4 of TLC of the present disclosure. The data of each feature vector may be divided into a first part P1, a second part P2 and a third part P3, which are respectively stored in the high page, the middle page and the low page according to importance of data for each part.

TABLE 5

(data allocation DA_4)

| | | | |
|---|---|---|---|
| High page (the first bit CB1) | first part P1 of feature vector q1 | first part P1 of feature vector q2 | first part P1 of feature vector q3 |
| Middle page (the second bit CB2) | second part P2 of Feature vector q1 of face F1 | second part P2 of feature vector q2 of face F2 | second part P2 of feature vector q3 of face F3 |
| low page (the third bit CB3) | third part P3 of Feature vector q1 of face F1 | third part P3 of feature vector q2 of face F2 | third part P3 of feature vector q3 of face F3 |

The above-mentioned embodiments describe various data patterns and data allocations of the MLC and TLC with less equivalent number of bits. Similar mechanism may also be applied to the quad level cell (QLC).

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
    a memory array, for storing a plurality of vector data, the vector data at least include an input feature vector and an output feature vector, each vector data has an MSB vector and a LSB vector, comprising:
        a plurality of memory units, each memory unit has a first bit and a second bit, the first bit is used to store the MSB vector of each vector data, and the second bit is used to store the LSB vector of each vector data,
    and
    a plurality of data latches, comprising:
        a first data latch;
        a second data latch; and
        a common data latch,
    wherein a bit line corresponding to each vector data executes one time of bit-line-setup, and reads the MSB vector and the LSB vector of each vector data according to the bit line, the threshold voltage distribution of each memory unit is divided into N states, N is a positive integer and N is less than 2 to the power of 2, and the effective bit number stored by each memory unit is less than 2; and
    wherein the common data latch receives the input feature vector from the memory device externally, then the input feature vector is transferred from the common data latch and then temporarily stored to the first data latch, the memory device executes a selective bit line read operation based on the input feature vector in the first data latch to read the MSB vector and the LSB vector of the input feature vector according to the corresponding bit line which have been performed with the bit-line-setup, so as to obtain the output feature vector, then the output feature vector is temporarily stored in the second data latch.

2. The memory device according to claim 1, wherein a physical page of the memory array has a plurality of logic pages, the logic pages include a high page and a low page, the high page corresponds to the first bit to store the MSB vector, the low page corresponds to the second bit to store the LSB vector.

3. The memory device according to claim 1, wherein each memory unit is a multi-level cell (MLC), the threshold voltage distribution of each memory unit is divided into a first state, a second state and a third state;

wherein, the first state only corresponds to a data with the first bit of "1" and the second bit of "0", or the first state only corresponds to a data with the first bit of "1" and the second bit of "1".

4. The memory device according to claim 1, wherein each memory unit is a multi-level cell (MLC), the threshold voltage distribution of each memory unit is divided into a first state, a second state and a third state;
wherein, the third state only corresponds to a data with the first bit of "0" and the second bit of "0", or the third state only corresponds to a data with the first bit of "0" and the second bit of "1".

5. The memory device according to claim 1, wherein each memory unit is a triple-level cell (TLC), each memory unit further includes a third bit, the first bit is used to store a first part of each vector data, the second bit is used to store a second part of each vector data, the third bit is used to store a third part of each vector data;
wherein, the threshold voltage distribution of each memory unit is divided into N states, N is a positive integer and N is less than 2 to the power of 3, and the effective bit number stored by each memory unit is less than 3.

6. The memory device according to claim 1, wherein the vector data further include a plurality of weight feature vectors, and the memory array comprises:
a plurality of word lines, for storing the weight feature vectors;
wherein, the memory device executes the selective bit line read operation to read the weight feature vectors from the word lines respectively.

7. The memory device according to claim 6,
wherein the memory device executes a multiplying-operation according to the input feature vector and one of the weight feature vectors.

8. The memory device according to claim 7, wherein the second data latch temporarily stores a result of the multiplying-operation, and the memory device executes an accumulating-operation according to a result of the multiplying-operation.

9. An operating method of a memory device, wherein the memory device includes a memory array and a plurality of data latches, the memory array includes a plurality of memory units each having a first bit and a second bit, and the data latches include a first data latch, a second data latch and a common data latch, and the operating method comprising:
storing a plurality of vector data in the memory array, the vector data at least include an input feature vector and an output feature vector, and each vector data has an MSB vector and a LSB vector;
storing the MSB vector of each vector data in the first bit;
storing the LSB vector of each vector data in the second bit;
executing one time of bit-line-setup for a bit line corresponding to each vector data;
reading the MSB vector and the LSB vector of each vector data according to the bit line;
receiving the input feature vector from the memory device externally, by the common data latch;
transferring the input feature vector from the common data latch, and then temporarily storing the input feature vector to the first data latch;
executing a selective bit line read operation based on the input feature vector in the first data latch to read the MSB vector and the LSB vector of the input feature vector according to the corresponding bit line which have been performed with the bit-line-setup, by the memory device, so as to obtain the output feature vector; and
temporarily storing the output feature vector in the second data latch;
wherein the threshold voltage distribution of each memory unit is divided into N states, N is a positive integer and N is less than 2 to the power of 2, and the effective bit number stored by each memory unit is less than 2.

10. The operating method according to claim 9, wherein a physical page of the memory array has a plurality of logic pages, the logic pages include a high page and a low page, the high page corresponds to the first bit to store the MSB vector, the low page corresponds to the second bit to store the LSB vector.

11. The operating method according to claim 9, wherein each memory unit is a multi-level cell (MLC), the threshold voltage distribution of each memory unit is divided into a first state, a second state and a third state;
wherein, the first state only corresponds to a data with the first bit of "1" and the second bit of "0", or the first state only corresponds to a data with the first bit of "1" and the second bit of "1".

12. The operating method according to claim 9, wherein each memory unit is a multi-level cell (MLC), the threshold voltage distribution of each memory unit is divided into a first state, a second state and a third state;
wherein, the third state only corresponds to a data with the first bit of "0" and the second bit of "0", or the third state only corresponds to a data with the first bit of "0" and the second bit of "1".

13. The operating method according to claim 9, wherein each memory unit is a triple-level cell (TLC), each memory unit further includes a third bit, the operating method comprises:
storing a first part of each vector data in the first bit;
storing a second part of each vector data in the second bit; and
storing a third part of each vector data in the third bit;
wherein, the threshold voltage distribution of each memory unit is divided into N states, N is a positive integer and N is less than 2 to the power of 3, and the effective bit number stored by each memory unit is less than 3.

14. The operating method according to claim 9, wherein the vector data further include a plurality of weight feature vectors, and the memory array comprises a plurality of word lines for storing the weight feature vectors, the operating method further comprises:
Executing the selective bit line read operation to read the weight feature vectors from the word lines respectively.

15. The operating method according to claim 14, wherein the operating method further comprises:
executing a multiplying-operation according to the input feature vector and one of the weight feature vectors.

16. The operating method according to claim 15, wherein the operating method further comprises:
temporarily storing a result of the multiplying-operation in the second data latch; and
executing an accumulating-operation according to a result of the multiplying-operation.

* * * * *